United States Patent [19]

Amada et al.

[11] 4,409,559
[45] Oct. 11, 1983

[54] SUPPLY VOLTAGE CONTROLLED STEREOPHONIC AMPLIFIER SYSTEM

[75] Inventors: Nobutaka Amada; Harushige Nakagaki; Shigeki Inoue, all of Toyokawa, Japan

[73] Assignee: Hitachi, Ltd., Tokyo, Japan

[21] Appl. No.: 247,736

[22] Filed: Mar. 26, 1981

[30] Foreign Application Priority Data

Mar. 26, 1980 [JP] Japan .................................. 55-37538
Dec. 4, 1980 [JP] Japan ................................ 55-170268

[51] Int. Cl.³ .............................................. H03F 3/68
[52] U.S. Cl. .................................... 330/295; 330/297
[58] Field of Search ............... 330/123, 128, 202, 295, 330/297

[56] References Cited

U.S. PATENT DOCUMENTS 4,339,730  7/1982  Yokoyama ..................... 330/297

Primary Examiner—James B. Mullins
Attorney, Agent, or Firm—Antonelli, Terry & Wands

[57] ABSTRACT

A power supply controlled stereophonic amplifier system of a simplified circuit configuration which includes an analog logic circuit that generates a larger one of the input signals for left and right channels thereby to control the output voltage of the DC-DC converter as a power supply by means of a pulse train of pulse widths that change according to the output of the logic circuit. The output of the analog logic circuit is compressed by a signal compression means which functions to compensate for the non linear response of the DC-DC converter.

8 Claims, 15 Drawing Figures

$$E = \frac{N_2}{N_1} E_1 \frac{D}{1-D}$$

DUTY FACTOR D

SUPPLY VOLTAGE CONTROLLED STEREOPHONIC AMPLIFIER SYSTEM

BACKGROUND OF THE INVENTION

The present invention relates to a supply voltage controlled stereophonic amplifier system which has a high power efficiency and a simple circuit configuration.

In general, a stereophonic reproduction system has a wide dynamic range of processing signals. Therefore, in order to minimize the distortion of the power amplifier circuit due to excessive input signals, a relatively high power amplifier circuit is necessary.

However, the use of a class "A" amplification circuit causes troublesome problems resulting from much power consumption and heat dissipation. For this reason, a class "B" amplification circuit has been so far employed in many applications, even if a class "B" amplification output circuit requires a special circuit to prevent the switching distortion thereof.

FIG. 1 shows an example of such a class "B" amplification circuit which includes an input signal source 1, a pre-amplifier 2 for amplify the input signal to a predetermined output voltage level, output transistors 3 and 4 for power amplification, a loud speaker 5, and batteries 6 and 7.

As well known, the power efficiency ($\eta$) of a class "B" amplifier is given by $$\eta = P_o/(P_o + P_c)$$

Where, $P_o$ is an output power of the amplifier to be supplied to the associated lound speaker, and $P_c$ is a loss power. The power efficiency ($\eta$) of a prior art class "B" amplifier varies with the output level ($P_o$), as shown by curve A in FIG. 2, in which the abscissa represents the normalized output ($P_o/P_{omax}$) when the maximum output $P_{omax}$ is expressed by 100%, and the ordinate represents the power efficiency ($\eta$). It will be seen from FIG. 2 that the power efficiency of the class "B" amplifier is good and 78% at the point of the maximum output, but for the smaller output levels, the power efficiency drops remarkably in such a manner that the average efficiency becomes less than 30%, for example, with respect to musical signals because the difference between the peak level and the average level is great. As a result, a use of higher power amplifier circuits involves increased heat dissipation, thereby making the heat radiation design difficult. In addition, in the case that the amplifier circuit is fabricated in the form of an IC circuit, this imposes serious limitation to the allowable maximum output of the IC circuit.

To eliminate such problems, there has been proposed by the same inventors as the present application in the Japanese Patent Laid-Open No. 73862-1976, an amplifier circuit in which the power supply comprises a switching DC-DC converter and the duty factor of the switching voltage is controlled (on the pulse width modulation (PWM) basis) according to the input signal to provide the variable supply voltage (which has been so far fixed), thereby to improve the power efficiency.

FIG. 3 shows an example of the disclosed amplifier circuit which has a d.c. power supply 8, a DC-DC converter 9, positive and negative output voltage terminals of the DC-DC converter, a full-wave rectifying circuit 12, a PWM converter 13, and a pulse amplifier 14. The d.c. power supply 8 consists of a.c. power input terminals 17, 18, diodes 19, 20, 21 and 22 for full-wave rectification, and a smoothing capacitor 23 and acts to rectify and smooth the a.c. supply voltage directly. The DC-DC converter 9 further includes a switching transistor 24, high-frequency transformers 25, 26, high-speed rectifying diodes 27, 28, and smoothing capacitors 29, 30. The PWM converter 13 includes a triangular or saw tooth carrier wave oscillator 15 and a comparator 16. The other reference numerals 1 to 7 in FIG. 3 represent the same or equivalent circuits or components as or to those in FIG. 1. It will be appreciated that the full-wave rectifying circuit 12 may be replaced with a half-wave rectifying circuit, in which case, the similar carrier converter and comparator must be added for the negative region of the input signal.

The comparator 16 compares the absolute value $|e_i|$ of an input signal with a carrier wave CR of, for example, 200 KHz, and if CR is less than $|e_i|$, then produces a pulse of constant level H. The pulse width W of the output wave PWM varies with the input signal $|e_i|$ (see FIG. 4 (B)).

In the operation of the circuit of FIG. 3, an input signal $e_i$ is supplied from an input signal source 1 via a pre-amplifier 2 to output transistors 3 and 4. The signal $e_i$ is also fed to the full-wave rectifying circuit 12 where the absolute value $|e_i|$ of the signal is sent to the pulse width modulation (PWM) converter 13. In the PWM converter 13, the absolute level $|e_i|$ is converted to the corresponding PWM wave to drive the DC-DC converter 9. That is, the driving of the DC-DC converter 9 with the PWM signal can allow the corresponding change of the output voltage $\pm e$ of the converter 9, i.e. the output voltage of a main-amplifier circuit MA including a pre-amplifier 2 and output transistors 3 and 4, according to the absolute value of the input signal $e_i$.

The operation of the DC-DC converter 9 will be next explained. When a positive voltage is applied via the PWM converter 13 and the pulse amplifier 14 to the base of the switching transistor 24, the transistor 24 is turned on. This will cause an induction of a voltage on a primary winding of the high-frequency transformer 25, which voltage has the polarity shown in FIG. 3 and is equal to a voltage across the smoothing capacitor 23.

In this connection, a secondary winding of the transformer 25 is invertedly connected to the primary winding thereof so that a voltage on the secondary winding is inverse to a voltage on the primary winding with respect to the polarity. Therefore, the rectifying diodes 27 and 28 will provide an open circuit to the secondary winding, so that energy is accumulated in the primary winding of the high-frequency transformer 25.

Subsequently, if the switching transistor 24 is turned off, then the primary winding is opened so that the energy accumulated in the primary winding is supplied to the amplifier circuit MA via the rectifier diodes 27 and 28.

On the other hand, according to the theoretical analysis, the output voltage $\pm e$ which develops on one terminal 10 or 11 of the smoothing capacitor 29 or 30 while the diodes 27 and 28 are in the conduction state, is expressed as $$e = \frac{D}{1-D} \cdot \frac{N_2}{N_1} \cdot E_1 - V_F$$

where, D is the duty factor by which the switching transistor 24 remains turned on, $N_1$ is the number of turns of the primary winding in the high-frequency transformer 25, $N_2$ is the number of turns of the secondary winding in the high-frequency transformer 25, $E_1$ is a voltage across the smoothing capacitor 23, and $V_F$ is the threshold voltage of the current diode 27 or 28.

It will be obvious from the above equation that a change of the duty factor of the switching voltage causes the corresponding change of the ratio of the number of turns of the primary winding with respect to that of the secondary winding, thereby providing the rectified outputs proportional to the duty factor with respect to the output terminals 10 and 11.

In other words, the driving of the switching transistor 24 according to the PWM signal converted from the input signal $e_i$ will produce the rectified outputs depending on the PWM signal, whereby the supply voltage of the amplifier circuit can be controlled according to the level of the input signal $e_i$ so that the output transistors 3 and 4 always operate substantially in their maximum output conditions.

There is shown the relationship between the supply voltage ±e (shown by broken lines) and the output voltage $e_o$ (shown by a solid line) of the main amplifier circuit MA in FIG. 5 in which the abscissa represents the time and the ordinate represents the voltage, $E_m$ and $-E_m$ are the peak and valley voltages of the output voltage $e_o$, and $E_o$ and $-E_o$ are the minimum and maximum levels of the supply voltages +e and −e, respectively. In this way, a small constant voltage $E_o$ is applied at all times only to that one of the output transistors 3 and 4 which remains turned on. This means that the power loss of the arrangement of FIG. 3 is considerably reduced thereby to improve the power efficiency remarkably, when compared to a known one.

More specifically, when the output voltage of the transistor 3 in operation is $E_1$ at a time $t_1$, the supply voltage is very small and slightly $E_2$. It will be appreciated that this results in remarkably reduced power consumption from the fact that a constant voltage $E_3$ (which is greater than $E_2$) is applied at all times in the case of a prior art power supply. At the same point of time $t_1$, a negative voltage $E_4$ is applied to the transistor 4. Since the transistor 4 is in the cut-off condition, however, the power loss of the transistor 4 is substantially zero.

Although the above explanation has been made in connection with FIG. 5 in which the d.c. power supply 8 is used to rectify and smooth a voltage directly from an a.c. power line (for example, from a commercial 50 Hz/60 Hz a.c. power source), it will be understood that the d.c. power supply may be replaced by a suitable d.c. source such as an automobile battery or dry cells, without providing a change of the basic operation thereof.

It will be also noted from curve B in FIG. 2 that the power supply controlled amplifier circuit of FIG. 3 is improved in its power efficiency from about ⅓ to about ½, especially the power efficiency for the smaller output signals is substantially increased.

Although the amplifier system of FIG. 3 is relatively complex in the circuit configuration; the system allows the use of the compact heat radiator due to the improved power efficiency and the use of the smaller power supply transformer because of its high frequency operation, in addition to a substantial reduction of the power consumption. This will allow an achievement of a lighter-weight and more compact system.

An audible or sound signal amplifier system generally is of stereophonic type, that is, has two input/output channels as a left channel and a right channel. In addition, although it is too much to say that there is no correlation between the right and left channel signals perfectly, in some applications, there may exist a substantially different correlation therebetween. However, on an average, it is common that there does not exist not so strong correlation therebetween. Therefore, where the amplifier system of FIG. 3 is employed in a stereophonic amplifier circuit, exactly the same system of FIG. 3 is required for each of the left and right channels, which requires a larger scale power supply circuit, thereby cancelling the advantage of the original smaller radiator and power supply transformer.

SUMMARY OF THE INVENTION

Accordingly, an object of the present invention is to provide a power supply controlled stereophonic amplifier system which eliminates the above defects in the prior art and in which the power supply and control signal circuits are used commonly for both the channels of a stereophonic system, together with the simplified circuit configuration.

In order to accomplish the object, the present invention provides a power supply controlled stereophonic amplifier system in which, as a feature, the instantaneous power supply voltage is controlled according to a larger one of both the left/right channel signals.

DESCRIPTION OF THE PREFERRED EMBODIMENTS

The present invention will now be explained with reference to preferred embodiments of a power supply controlled stereophonic amplifier system.

Figure 1:
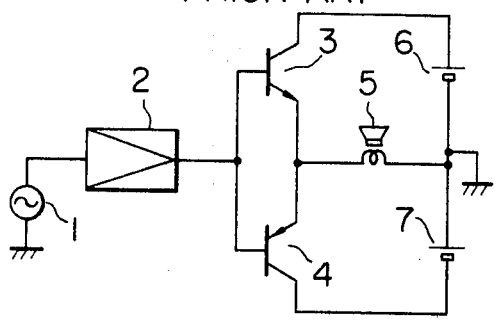
FIG. 1 shows an arrangement of a prior art class "B" output amplifier circuit.
Figure 2:
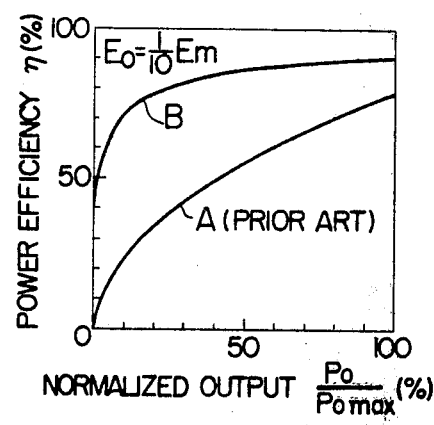
FIG. 2 shows a characteristic curve diagram of the power efficiency A of the circuit of FIG. 1.
Figure 6:
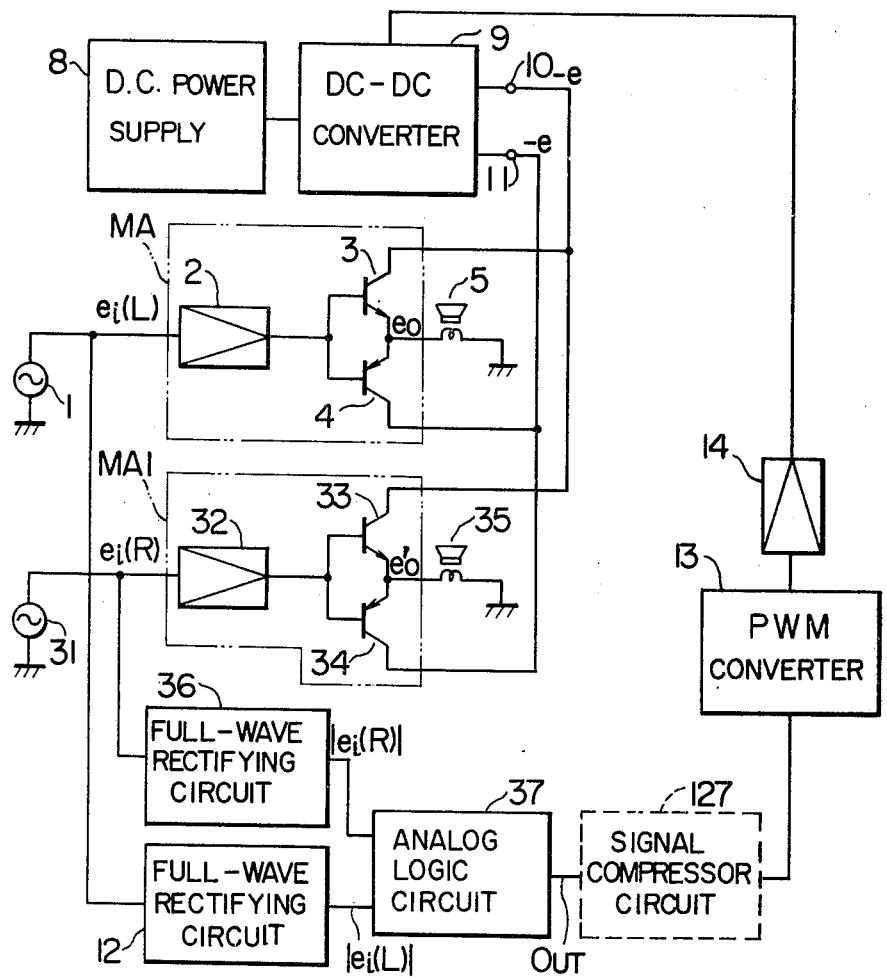
FIG. 6 shows a block diagram of an embodiment of a power supply controlled stereophonic amplifier system in accordance with the present invention.

Turning now to FIG. 6, there is shown an embodiment of the power supply controlled stereophonic amplifier system which includes an input signal source 31, for example, for the right channel, a pre-amplifier 32, output transistors 33 and 34, a loud speaker 35, a full-wave rectifying circuit 36, and an analog logic circuit 37. The other reference numerals in FIG. 6 represent the same or equivalent circuits or components as or to those in FIG. 1 or FIG. 3.

Figure 4:
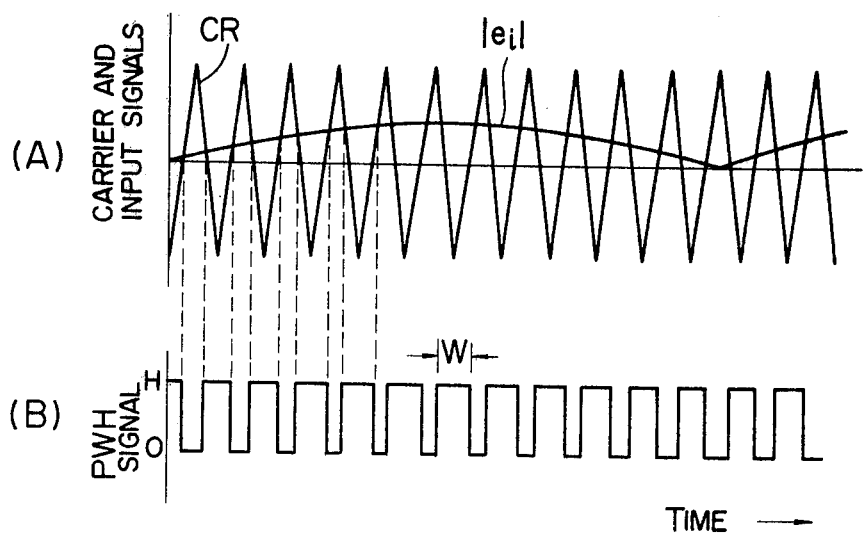
FIG. 4 shows a waveform diagram of assistance in explaining the operation of pulse width modulation of the system of FIG. 3.

In the operation of the system of FIG. 6, input signals of two left/right channels from the input signal source 1 and 31 are supplied to the full-wave rectifier circuits 12 and 36, respectively, to generate the absolute value of each input signal therein. The two absolute values generated are fed to the logic circuit 37 where a larger one of the two values is applied to the PWM converter 13. In the same manner as in FIGS. 3 and 4, the PWM converter 13 converts the larger signal to the corresponding PWM signal, and the converted PWM signal is used to control the supply voltage ±e of the DC-DC converter 9, which supply voltage is shared between the left and right channels.

Figure 7:
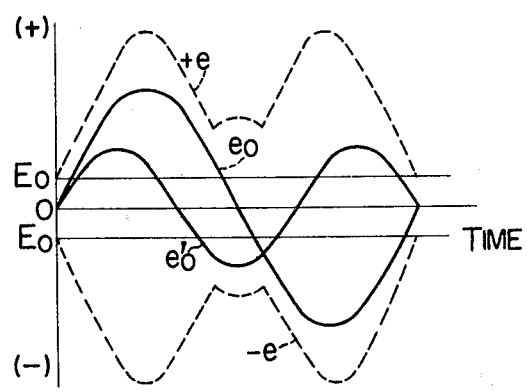
FIG. 7 shows waveforms of the output voltages of the amplifier circuits MA and MA1 and the DC-DC converter in the system of FIG. 6.

In this connection, there is shown in FIG. 7 the relationship between the output voltage $e_o$ and $e_o'$ of the left/right channels and the supply voltage ±e. It will be seen from FIG. 7, as in FIG. 5, that the power efficiency is improved.

It will be also clear from FIG. 7 that, in the embodiment, even if any signals are applied to the left/right channels, the voltage ±e and −e on the supply terminals 10 and 11 follow a larger one of the output voltages $e_o$ and $e_o'$ in such a manner as to make sure to be greater than the larger output voltage, which eliminates the possibility of missing output signals. The voltage applied to the output transistors 3, 4 or 33, 34 does not become constant, but it is made sure that the supply voltage is higher than the output voltage of the output transistor which has the larger output voltage. For this reason, when the difference between input signals levels of the left and right channels becomes greater, the power efficiency will decrease slightly. However, even the slightly decreased power efficiency, of course, will be much higher than that of an ordinary class "B" output circuit of prior art.

Figure 8:
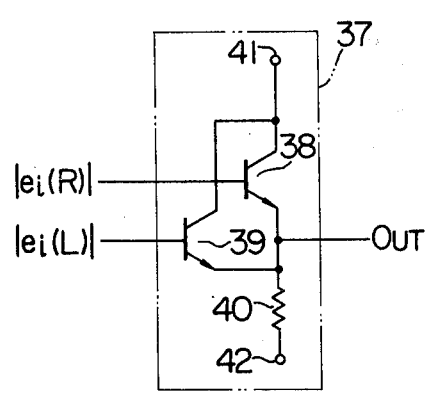
FIG. 8 shows an embodiment of the analog logic circuit in FIG. 6.

There is shown in FIG. 8 an embodiment of the analog logic circuit 37 which includes transistors 38, 39, a resistor 40, and positive and negative supply terminals 41, 42. In the operation of the circuit of FIG. 8, input signals are applied to the bases of the transistors 38 and 39. A larger one of the input signals turns the associated transistor on and a smaller one thereof turns the remaining transistor off. Therefore, the larger input signal alone appears on the common emitter terminal. As a result, if a signal from the full-wave rectifier circuit 36 is supplied to the base of the transistor 38 and a signal from the full-wave rectifier circuit 12 is supplied to the base of the transistor 39, then the logic circuit 37 functions as an analog one.

Figure 9:
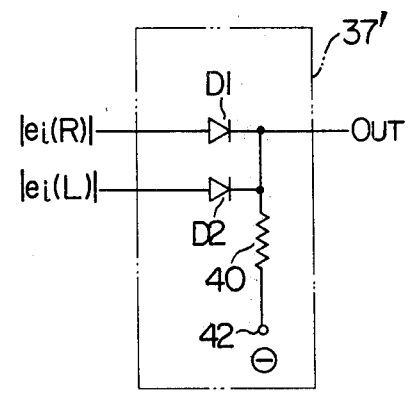
FIG. 9 shows another embodiment of the analog logic circuit in FIG. 6.

FIG. 9 shows an alternative embodiment of the analog logic circuit 37 of FIG. 8 which includes diodes D1 and D2. The operation of the diodes is similar to that of FIG. 8.

Figure 3:
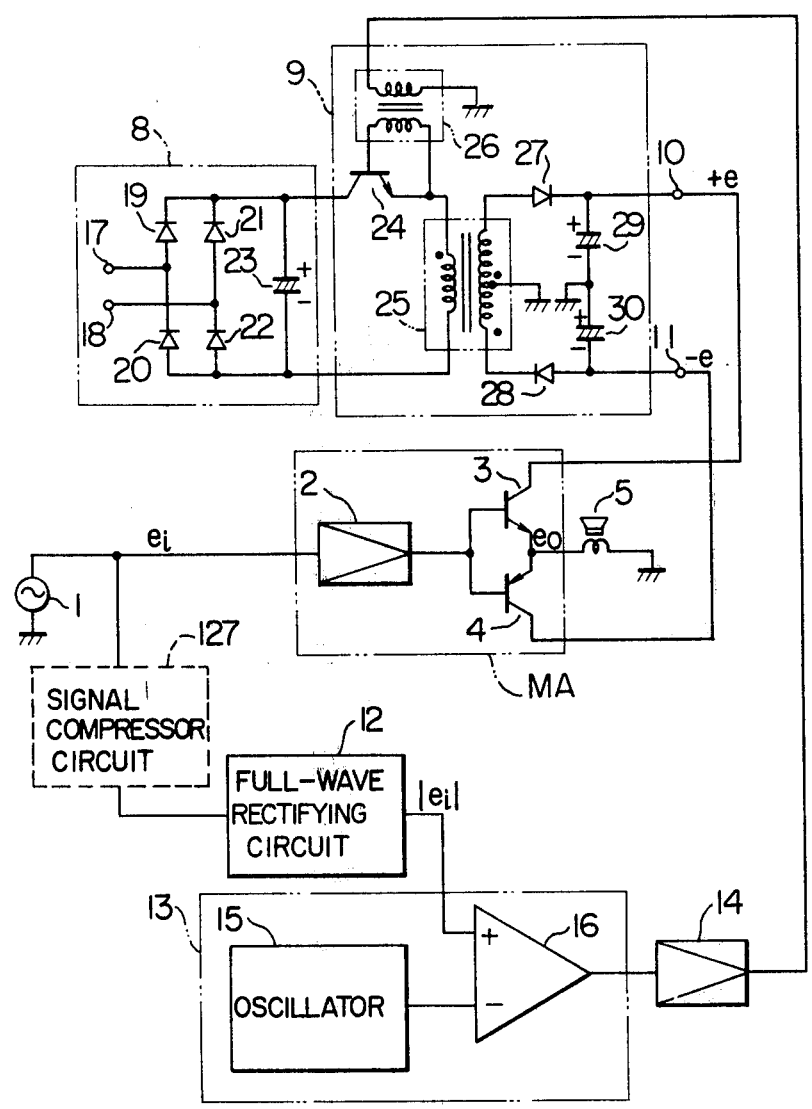
FIG. 3 shows an arrangement of a prior art power supply controlled amplifier system.

Although the power efficiency of the prior art system of FIG. 3 is improved to a certain extent, the prior art system also has a defect that in the region where the input signal $e_i$ becomes high so that the output $e_o$ of the output amplifier circuit MA approaches to its maximum, the collector-to-emitter voltage of the output transistors 3 and 4 exceeds a predetermined level, resulting in the fact that the improved power efficiency is not satisfactory.

Figure 5:
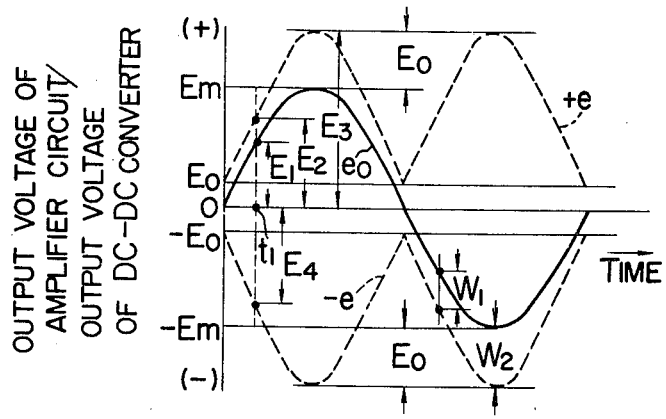
FIG. 5 shows waveforms of the output voltages of the amplifier circuit MA and the DC-DC converter in the system of FIG. 3.

In other words, as the input signal $e_i$ increases, the build-up rate of the output voltage ±e of the DC-DC converter 9 becomes faster than that of the input signal $e_i$, that is, W2 becomes larger than W1 in FIG. 5.

The reason why W2 becomes larger than W1 will be explained with reference to FIGS. 10 and 11.

Figure 10:
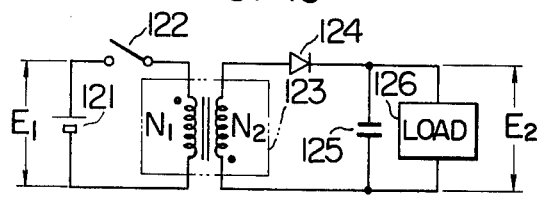
FIG. 10 shows a circuit diagram of the DC-DC converter of FIG. 3 or FIG. 6 for explanation of the operation thereof.

FIG. 10 shows an equivalent circuit of the DC-DC converter in FIG. 3 or FIG. 6 for explanation of the operation thereof, wherein a d.c. power supply 121 corresponds to the d.c. power supply 8, similarly, a switch 122 corresponds to the switching transistor 24, a transformer 123 corresponds to the transformer 25, a diode 124 corresponds to the diodes 27, 28, and a capacitor 125 corresponds to the capacitors 29, 30, in FIG. 3 or FIG. 6, respectively. Further, in FIG. 10, a load 126 corresponds to the output amplifier circuit MA, $E_1$ is the voltage of the d.c. power supply 121 and $E_2$ is the output voltage applied across the load 126.

As will be clearly seen from FIG. 10, since the primary winding of the transformer 123 has the inversed polarity with respect to the secondary winding thereof, a voltage with the inversed polarity generates on the secondary winding of the transformer 123 when the switch 122 is switched on. In this case, the diode 124 is off, and a primary current flows from the d.c. power supply 121 to the primary winding of the transformer 123 to store the energy in the primary winding. Subsequently, as soon as the switch 122 is switched off, the secondary side voltage is inversed to make the diode 124 conductive, so that the energy previously stored in the primary winding is supplied to the load 126 through the secondary winding.

And, if the switch 122 is repeatedly turned on and off at selected intervals, the output voltage $E_2$ at the secondary side is given by the following equation.

$$E_2 \simeq \frac{N_2}{N_1} \cdot E_1 \cdot \frac{T_{ON}}{T_{OFF}} = \frac{N_2}{N_1} \cdot E_1 \cdot \frac{D}{1-D}$$

where, $E_1$ is the input voltage at the primary side, $N_1$ and $N_2$ are respectively the number of turns of the primary and secondary windings of the transformer 123, $T_{ON}$ and $T_{OFF}$ are respectively the on and off time duration when the switch 122 is on and off, and D is the duty factor and expressed as.

$$D = T_{ON}/(T_{ON} + T_{OFF})$$

Figure 11:
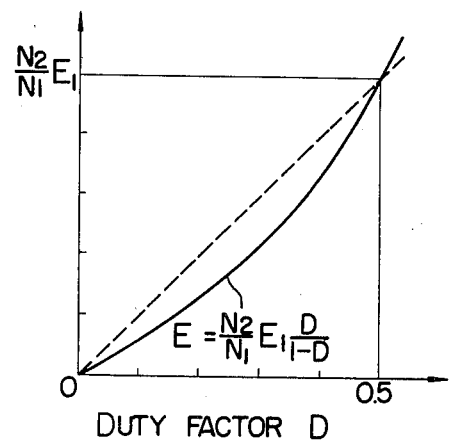
FIG. 11 shows a characteristic curve diagram of the converter of FIG. 10 for explanation of the operation thereof.

The relationship between the secondary output voltage $E_2$ and the duty factor D is given in FIG. 11.

In this way, there will not exist a linear relation between the duty factor D and the secondary output voltage $E_2$, that is, the output voltage $E_2$ increases at a faster rate than the duty factor D increases.

On the other hand, the PWM converter 13 operates linearly with the input signal $e_i$ in such a manner that the pulse width W of the PWM signal is proportional to the level of the input signal $e_i$. This results in the fact that the output voltage ±e increases at a faster rate than the level of the input signal $e_i$ increases, as has been already described above. The above explanation will be understood from the relationship between $W_1$ and $W_2$ in FIG. 5.

As will be appreciated from FIG. 5, in the above system, the output voltage ±e of the DC-DC converter 9 increases not maintaining a fixed voltage difference with respect to the output voltage $e_o$, i.e. not maintaining the relation of $W_1 = W_2$, but at a faster rate than the output voltage $e_o$ increases with the increased level of the input signal $e_i$ supplied to the output amplifier circuit MA. This means that as the input signal $e_o$ increases, the power loss increases correspondingly, resulting in the reduction of the power efficiency.

In accordance with another aspect of the present invention, there is provided in FIG. 6 an improved power supply controlled output amplifier system which includes a signal compressor circuit 127 and which operates without the increasing power loss and the corresponding reduction of the power efficiency, even at the vicinity of there maximum output of the output amplifier circuit MA or MA1.

An addition of the signal compressor circuit 127 to the prior art system of FIG. 3 will provide the further improved power efficiency than the improvement of the prior art power efficiency explained already in connection with FIG. 5, which will be explained hereinafter with reference to FIG. 12.

The embodiment of FIG. 6 is different from the embodiment of FIG. 3, in that the embodiment of FIG. 6 is added only with the signal compressor circuit 127 which forms another feature of the present invention.

Figure 13:
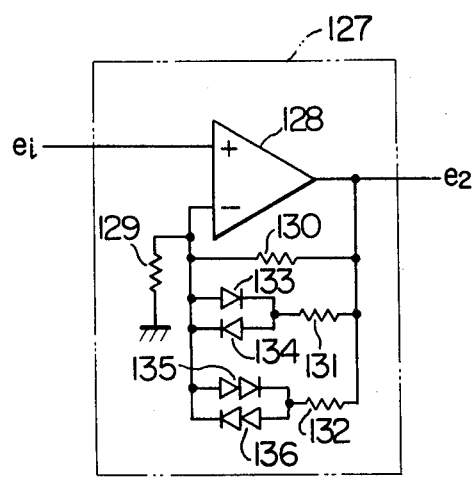
FIGS. 13 and 14 show different embodiments of the signal compressor circuit of FIG. 6.

FIG. 13 shows an embodiment of the signal compressor circuit 127 which includes an operational amplifier 128, resistor 129 to 132, and diodes 133 to 136 and functions to compress the level of the input signal to supply it to the associated PWM converter. There is shown in FIG. 15 the relationship between the input voltage $e_i$ and the output voltage $e_2$ in FIG. 13, i.e. the gain of the signal compressor circuit 127; in which in the first region where the output voltage $e_2$ is lower than the forward voltage $V_F$ of the diode, the gain is determined by the ratio of the resistor 129 to the resistor 130; in the second region where the output voltage $e_2$ is between $V_F$ and $2V_F$, the gain drops when compared to that in the above first region because the resistor 131 is added across the resistor 130; and in the third region where the output voltage $e_2$ is higher than $2V_F$, the gain drops further when compared to that in the second region because the parallel circuit of the resistors 130, 131 and 132 is formed.

Figure 15:
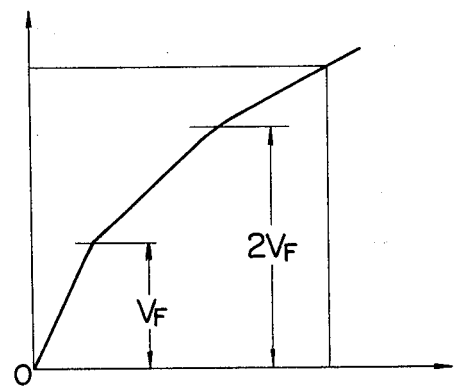
FIG. 15 shows a characteristic curve diagram of the signal compressor circuit of FIG. 13 for explanation of the operation thereof.

In FIG. 15, the abscissa represents the input voltage $e_2$ and the ordinate represents the output voltage $e_2$. In this way, as the level of the input signal $e_i$ increases, the gain decreases continually, which means signals compression can be achieved. Therefore, a suitable selection of the number of diodes 133 to 136 or the values of the resistors 130 and 131 can provide a desired compression characteristic.

When the input signal $e_i$ is supplied from the signal source 1 via the signal compressor circuit 127 of the embodiment of FIG. 13 to the associated PWM converter 13 so as to provide a level compression of the input signal $e_i$ as shown in FIG. 15, the pulse width of the PWM signal available from the PWM converter 13 is compressed without having the proportional relationship to the level of the input signal $e_i$. In consequence, the duty factor D is compressed correspondingly to cancel the non-linearity of the output voltage ±e with respect to the duty factor D of the converter 9 as shown in FIG. 11, thereby providing the linear characteristic as shown by a broken line in FIG. 11.

Figure 12:
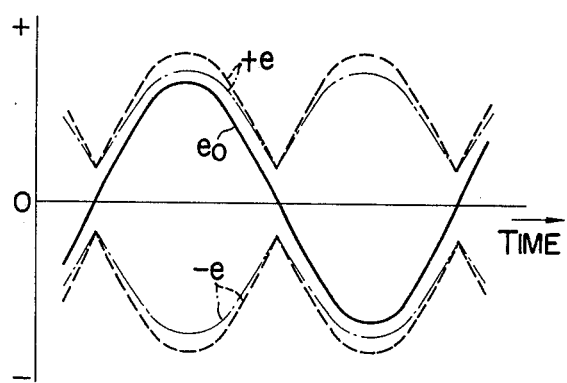
FIG. 12 shows waveforms of the output voltages of the amplifier circuits MA and MA1 and DC-DC converter in the system of FIG. 6 with a signal compressor circuit added.

As a result, with the embodiment of FIG. 6 including the signal compressor circuit 127, the relationship as shown by the solid and broken lines in FIG. 12 can be maintained between the output voltage $e_o$ (or $e_o'$) of the output amplifier circuit MA (or MA1) and the output voltage ±e of the DC-DC converter 9, whereby the collector-to-emitter voltage of the output transistors 3, 4 (or 33, 34) in operation can be kept at a nearly constant level, independently of the level of the input signal $e_i$.

More specifically, it will be seen best from FIG. 12 that the output voltage ±e varies with change in the output voltage $e_o$ in such a manner as keep a substantially constant voltage difference therebetween, unlike the non-constant relationship between $W_1$ and $W_2$. This means the further improved power efficiency can be achieved when compared to that available in the circuit of FIG. 3.

Figure 14:
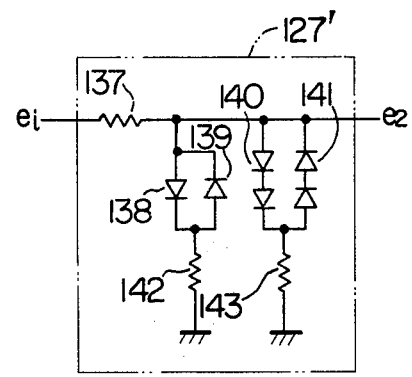

There is shown in FIG. 14 a modification of the signal compressor circuit of FIG. 13 in which an operational amplifier is not provided. The compressor circuit of FIG. 14 which consists of the diodes 138 to 141 and the resistors 137, 142 and 143 operates in the similar way to that of FIG. 13, with respect to the gain attenuation.

Further, the signal compressor circuit 127 or 127' may be replaced with a suitable circuit which is base on Zener diodes for signal compression.

With the arrangement as has been disclosed, the present invention can provide a power supply controlled stereophonic amplifier system suitable for high output operation which eliminates defects in the prior art, and which provides a substantially improved power efficiency and a simple circuit configuration, since the system can always maintain the collector-emitter voltage of the output transistors at a suitable level independently of the level of the input signal.

What is claimed is:

1. A power supply controlled stereophonic amplifier system comprising:
   two main amplifier circuits respectively corresponding to left and right channels;
   a switching regulator having a switching element for supplying a voltage to the main amplifier circuits;
   input signal level detecting means for detecting input signals supplied to said main amplifier circuits to produce a detected signal having a magnitude equal to the larger of the absolute values of the input signals;
   means for controlling said switching element in response to a compressed output signal produced from the detected signal, the supplied voltage of said main amplifier circuits varying as a function of said input signals;
   said input signal level detecting means including a signal compressor means which is responsive to the detected signal for producing the compressed output signal which is supplied to said means for controlling said switching elements whereby the voltage supplied to said main amplifier circuits is controlled.

2. An amplifier system according to claim 1 wherein said signal compressor circuit includes an operational amplifier having an input and an output, a first impedance coupled between said operational amplifier input and output, a second impedance coupled between said operational amplifier input and output which is conductive when the output voltage of the operational amplifier is larger than a first threshold voltage and a third impedance coupled between said operational amplifier input and output which is conductive when the output voltage is larger than a second threshold voltage which is larger than the first threshold voltage.

3. An amplifier system in accordance with claim 2, wherein the first impedance is a resistance; the second impedance is a series connection of a resistance and a first diode and the third impedance is a series connection of a resistance and a series connection of first and second diodes poled in the same direction.

4. An amplifier system in accordance with claim 3, wherein the second impedance has a second diode coupled in parallel with the first diode such that the diodes are poled in opposite directions and the third impedance has a series connection of third and fourth diodes poled in the same direction which is connected in parallel to the series connection of the first and second diodes and poled in the opposite direction as the first and second diodes.

5. An amplifier system according to claim 1, wherein the signal compressor circuit comprises a first impedance coupled between an input and an output of the signal compressor circuit, a second impedance coupled between the first impedance and a reference potential which is conductive when the input voltage is greater than a first threshold and a third impedance coupled between the first impedance and a reference potential which is conductive when the output voltage is larger than a second threshold voltage which is larger than the first threshold voltage.

6. An amplifier system in accordance with claim 5, wherein the first impedance is a resistance; the second impedance is a series connection of a resistance and a first diode and the third impedance is a series connection of a resistance and a series connection of first and second diodes poled in the same direction.

7. An amplifer system in accordance with claim 6, wherein the second impedance has a second diode coupled in parallel with the first diode such that the diodes are poled in the opposite direction and the third impedance has a series connection of third and fourth diodes poled in the same direction which is connected in parallel to the series connection of the first and second diodes, the third and fourth diodes being poled in the opposite direction as the first and second diodes.

8. In a power supply controlled stereophonic amplifier comprising two main amplifier circuits respectively corresponding to left and right channels; a switching regulator having a switching element for supplying a voltage to the main amplifier circuits; input signal level detecting means for detecting input signals supplied to said main amplifier circuits to produce a detected signal having a magnitude equal to the larger of the absolute values of the input signals and means for controlling said switching element in response to said detected signal level, the improvement comprising signal compressor means disposed between a source of the input signals and the means for controlling for producing a compressed output of the input signal to the signal compressor whereby the voltage supplied to said main amplifier circuits is controlled.

* * * * *